(12) United States Patent
Ramm et al.

(10) Patent No.: US 11,661,657 B2
(45) Date of Patent: May 30, 2023

(54) COATING COMPRISING MCRAL-X COATING LAYER

(71) Applicant: Oerlikon Surface Solutions AG, Pfäffikon, Pfäffikon (CH)

(72) Inventors: Juergen Ramm, Maienfeld (CH); Beno Widrig, Bad Ragaz (CH); Oliver Jarry, Cologne (DE); Oliver Hunold, Wädenswil (CH)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 0 days.

(21) Appl. No.: 17/050,604

(22) PCT Filed: Apr. 24, 2019

(86) PCT No.: PCT/EP2019/060488
§ 371 (c)(1),
(2) Date: Oct. 26, 2020

(87) PCT Pub. No.: WO2019/206979
PCT Pub. Date: Oct. 31, 2019

(65) Prior Publication Data
US 2021/0123141 A1    Apr. 29, 2021

Related U.S. Application Data

(60) Provisional application No. 62/661,817, filed on Apr. 24, 2018.

(51) Int. Cl.
*C23C 28/00* (2006.01)
*C23C 14/02* (2006.01)
(Continued)

(52) U.S. Cl.
CPC ........ *C23C 28/3215* (2013.01); *C23C 14/025* (2013.01); *C23C 14/081* (2013.01);
(Continued)

(58) Field of Classification Search
None
See application file for complete search history.

(56) References Cited

U.S. PATENT DOCUMENTS

2004/0244676 A1    12/2004   Schnell et al.
2007/0264523 A1    11/2007   Hu et al.
(Continued)

FOREIGN PATENT DOCUMENTS

CN    106835116 A  *   6/2017
CN    107574415 A        1/2018
(Continued)

OTHER PUBLICATIONS

Machine translation of CN106835116A via EPO, translated Jul. 29, 2022. (Year: 2017).*
Machine translation of JP 2001-279418 A via https://www.j-platpat.inpit.go.jp/, translated Jul. 29, 2022. (Year: 2001).*

*Primary Examiner* — Elizabeth Collister

(57) ABSTRACT

Coated substrate comprising a substrate (1) comprising a metal substrate surface (11) coated with a coating system (7) consisting of or comprising a functional coating film (5), said functional coating film (5) consisting of or comprising at least one MCr Al—X coating layer, whereas ° the at least one MCr Al—X coating layer is deposited directly on the metal substrate (11), or ° the at least one MCr Al—X coating layer is deposited on an intermediate coating layer (3) that is formed of at least one substrate matching layer (31), wherein the at least one substrate matching layer (31) is deposited directly on the metal substrate surface (11), wherein the layer deposited directly on the metal substrate surface (11), it means respectively the MCr Al—X coating layer if it is deposited directly on the metal substrate surface (11) or the substrate matching layer (31) if it is deposited on
(Continued)

the metal substrate surface (11) exhibits: ° epitaxial growth in part or totally, or ° heteroepitaxial growth in part or totally.

20 Claims, 12 Drawing Sheets

(51) Int. Cl.
*C23C 14/08* (2006.01)
*C23C 14/32* (2006.01)
*C23C 14/35* (2006.01)

(52) U.S. Cl.
CPC ............ *C23C 14/325* (2013.01); *C23C 14/35* (2013.01); *C23C 28/345* (2013.01)

(56) References Cited

U.S. PATENT DOCUMENTS

2011/0268987 A1* 11/2011 Schmitz .............. C23C 28/3215
428/654
2016/0160661 A1 6/2016 Balbach et al.

FOREIGN PATENT DOCUMENTS

| EP | 1295969 A1 | 3/2003 | |
|---|---|---|---|
| EP | 3029113 A1 | 6/2016 | |
| JP | 2001279418 A | * 10/2001 | ......... C23C 28/3215 |
| JP | 2007262447 A | 10/2007 | |
| JP | 4805523 B2 | 8/2011 | |
| WO | 2018193035 A1 | 10/2018 | |

* cited by examiner

| Element | Ni | Co | Cr | Mo | W | Ta | Al | Ti | Hf | B | Zr | Y | C |
|---|---|---|---|---|---|---|---|---|---|---|---|---|---|
| Superalloy 1 (PWA1483) [wt.%] | 60.33 | 9.0 | 12.2 | 1.9 | 3.8 | 5.0 | 3.6 | 4.1 | | | | | 0.07 |
| Superalloy 2 (CM247) [wt.%] | 61.8 | 9.2 | 8.1 | 0.5 | 9.5 | 3.2 | 5.6 | 0.7 | 1.4 | 0.015 | 0.015 | | 0.07 |
| NiCrAlY 1 [wt.%] | 67 | | 22 | | | | 10 | | | | | 1 | |
| NiCrAlY 2 [wt.%] | 47.5 | 23 | 17 | | | | 12 | | | | | 0.5 | |
| NiCrAlY 3 [wt.%] | 71 | | 14 | | | | 14 | | | | | 1 | |

Figure 11

COATING COMPRISING MCRAL-X COATING LAYER

The present invention relates to a new coating system comprising at least one MCrAl—X coating layer synthesized by using physical vapor deposition techniques, the coating being applicable for protecting metal substrates, in particular for protecting turbine components.

The main purpose of the present invention is to enable the synthesis of coatings which form excellent interfaces to "metal substrates" and which can be exposed to temperatures which are approaching the melting temperatures of the substrate material without delamination.

The term "metal substrate" used in the present description and in the context of the present invention refers to substrates made of a material exhibiting metallic properties, e.g. a nickel-based alloy or a nickel aluminide.

For example, a coating according to the present invention can be provided on surfaces of turbine blade tips for improving performance of these turbine blade tips. In this manner, the surface of the blade tip, which comes in contact with abradable material (rubbing) during operation is protected against mechanical wear and corrosion by the coating provided before operation according to the present invention.

Furthermore, a coating according to the present invention can provide a significantly improvement of metal substrates. In particular turbine blades made of a material consisting of or comprising a nickel-based alloy or a nickel aluminide exhibit a significantly increased oxidation resistance after being coated according to the present invention.

The deposition of the coating of the present invention is performed by Physical Vapour Deposition (PVD) methods, like cathodic arc evaporation, sputtering or high power pulsed sputtering (commonly known as High Power Impulse Magnetron Sputtering (HiPIMS) or High Power Pulsed Magnetron Sputtering (HPPMS)), preferably by cathodic arc evaporation.

The present invention provides a new, innovative and very useful coating 7 comprising a functional coating film 5, wherein the functional coating film 5 is formed of at least one MCrAl—X coating layer 5 synthesized by using physical vapor deposition techniques, as it is schematically shown in FIG. 1a, FIG. 1b and FIG. 1c.

Optionally, the coating 7 can comprise one top coating film 10 deposited atop the functional coating film 5 as it is shown in FIG. 1b.

According to a preferred embodiment of the present invention, the inventive coating system 7 comprises a functional coating film 5 and an intermediate coating film 3, wherein the intermediate coating film 3 is deposited on a surface 11 of a metal substrate 1, so that the intermediate coating film 3 is deposited between the surface 11 and the functional coating film 5, wherein the functional coating film 5 is formed of at least one layer MCrAl—X coating layer and the intermediate coating film 3 is formed of at least one substrate matching layer 31 made of a material that matches with the material of the surface 11 of the metal substrate 1.

Optionally, the intermediate coating film 3 can comprise a diffusion barrier layer 33 deposited on the substrate matching layer 31 that is deposited directly on the surface 11 of the metal substrate 1, as it is shown in FIG. 1c.

In cases, in which the at least one MCrAl—X coating layer constitutes already a substrate matching layer, because the element composition of the MCrAl—X coating layer and the element composition of the metal substrate are similar and the element composition of the MCrAl—X coating layer meets the criteria of the element composition of substrate matching layer as defined in the present description, then the MCrAl—X coating layer can be deposited directly on the surface of the metal substrate without using any intermediate coating film as it is shown in FIG. 1.

A metal substrate (and consequently the surface of a metal substrate coated with an inventive coating) in the context of the present invention consists preferably of one of the following materials:
  a superalloy,
  a nickel-based super alloy like Inconel (e.g. Inconel 718)
  an aluminide, more preferably nickel aluminide.

The substrate matching layer 31 according to the present invention can comprise for example the same or a similar chemical composition like the metal substrate surface 11 to be coated. Preferably it can comprise also the same or a similar crystalline structure, with preferably maximal mismatch in the lattice parameter of 5%, more preferably lower than 5%.

In the case that the above-mentioned materials are used as metal substrate surface 11, then the substrate matching layer 31 according to the present invention could be for example following:
  In the case of a superalloy substrate surface: a coating layer comprising the same or a similar chemical composition as the superalloy substrate material. For example, in the case of a substrate metal substrate surface 11 of Inconel, a suitable substrate matching layer 31 could be a Ni—Cr layer.
  In the case of Ni-Aluminides: a suitable substrate matching layer 31 could be a Ni—Al layer.

As already mentioned above, using similar composition of the elements present in the matching layer 31 in comparison with the composition of these elements in the metal substrate surface 11 is beneficial. Likewise, if the coating comprises or consists of at least one MCrAl—X layer and the at least one MCrAl—X layer is deposited directly on the metal substrate surface, using similar composition of the elements present in the MCrAl—X layer (deposited directly on the metal substrate surface) in comparison with the composition of these elements present in the metal substrate surface is beneficial.

The term "similar composition" of the elements present in the substrate matching layer or in the MCrAl—X layer (if deposited directly on the metal substrate surface) in comparison with the composition of these elements present in the metal substrate surface is beneficial refers in the context of the present invention to the main component or the main two components of the substrate material (all measured in wt. %). For explaining better what is meaning with the main component or the main components the Table 1 shown in FIG. 11 will be used. Referring to Table 1 (shown in FIG. 11), this means that for both the superalloy 1 substrate material and for the superalloy 2 substrate material, the element Ni is the main component. If relation to the two main components, then for the superalloy 1 substrate material the elements Ni and Cr are the main components while for the superalloy 2 substrate material Ni and Co are the main components.

A similar composition in this respect means that the concentration of the main component or the main components in the substrate differs from the concentration of the main component or the main components in the substrate matching layer or in the MCrAl—X coating layer deposited directly on the substrate surface in not more than 30% in composition (wt. %), preferably not more than 10% (wt. %).

It means that at least the main component or preferably the main two components of the material forming the metal substrate, respectively the metal substrate surface that is coated, must be present in the substrate matching layer or in the MCrAl—X layer that is deposited directly on the metal substrate surface and the requirements of above mentioned criteria regarding "similar composition" must be met. Referring again to Table 1 (shown in FIG. 11), it can be seen that NiCrAlY1 fulfil this requirement with respect to Ni content for both superalloy substrates 1 and 2. But this is not the case neither for the Ni nor for the Cr nor for the Co content of NiCrAlY2. However, NiCrAlY3 fulfills this requirement for Ni as well as Cr for superalloyl and for Ni for superalloy 2. This means that NiCrAlY1 and NiCrAlY3 can be directly deposited to the superalloy substrate 1 and 2, while NiCrAlY2 needs a matching layer and the formation of a gradient in composition to the composition of the MCrAlY coating.

Furthermore, as it was also already mentioned above preferably both the substrate matching layer 31 and the metal surface 11 of the material 1 have the same crystalline structure or a similar crystalline structure defined as similar if the maximal mismatch in the lattice parameter is of 5%.

In the case that the MCrAl—X layer is deposited directly on the substrate surface without using any intermediate coating layer, then it is also applicable that both the MCrAl—X-layer and the metal surface 11 of the material 1 have the same crystalline structure or a similar crystalline structure defined as similar if the maximal mismatch in the lattice parameter is of 5%.

Providing that at least one of the conditions mentioned before, e.g. similarity in composition and/or crystalline structure between the substrate and the matching layer or the MCrAl—X-layer, was fulfilled, it was surprisingly found that epitaxial growth of the matching layer or heteroepitaxial growth of the MCrAl—X-layer could be achieved in the interface between substrate and layer. This epitaxial or heteroepitaxial growth, in other words, means that the crystallographic registry between the substrate and the layer is maintained and the interface is coherent. For the definitions of the terms epitaxy, heteroepitaxy and coherence it is referred to the book of L. B. Freund and S. Suresh: "Thin Film Materials: Stress, Defect Formation and Surface Evolution", Cambridge, Cambridge University Press, 2003.

There are different methods to investigate interfaces for epitaxial or heteroepitaxial growth. Transmission electron microscopy of the cross section of an interface is one method to study the alignment of lattice planes between substrate and layer. The other method is the so called electron backscatter diffraction (EBSD) with crystal orientation mapping. In FIG. 10, a cross-section of the interface between a single crystalline superalloy substrate (PWA1483-SX) and a NiCrAlY1 is shown. The interface between the substrate and the layer is marked by a dashed line. The regions above the interface in which layer growth with the same crystal orientation is observed are marked by circles. Coherent growth can be observed over large areas of the interface and the thickness of the coherent growth is typically between 200 nm and 2 μm. This coherent growth was achieved as a result of the deposition of the NiCrAlY1 on the superalloy 1 substrate. This means that this coherent interface was already achieved during deposition, i.e. in-situ.

Table 1 (shown in FIG. 11) shows that for NiCrAlY1 layer and the superalloy 1 substrate the chemical compositions of Ni are similar according to our previous definition. In addition, we measured the lattice constants of NiCrAlY1 and the superalloy substrate 1 by X-ray diffraction (XRD) method. NiCrAlY1 has a major cubic cell with a=3.560 Å which is about only 1% smaller (it corresponds to a maximal mismatch in the lattice parameter of about 1% which confirms a MCrAl—X coating layer with similar crystalline structure like the substrate material according to the present invention as explained above) compared to superalloy substrate 1 (PWA1483) with a=3.591 Å. This means that also the second criteria for epitaxial or heteroepitaxial growth was fulfilled.

However, in many cases for which the above conditions for coherency are not fulfilled it could be observed that a short annealing to about 1000° C. for one hour after deposition results in the formation of coherent interfaces between superalloy substrate and MCrAl—X layer. This was investigated and is due to diffusion processes in the interface which are initiated by the difference in elemental composition between the superalloy substrate and the MCrAl—X layer. As soon as these differences are not to large, the diffusion process does not result in hole formation and mechanical instability.

In the following, some examples of MCrAl—X and MCrAl—X-O layers according to the present invention are given. The coatings were deposited by cathodic arc evaporation using powder metallurgical manufactured targets of the respective MCrAl—X material.

For example, a target having chemical composition NiCrAlY1 67/22/10/1 (wt %) was used for depositing by arc evaporation an NiCrAlY1 layer (MCrAl—X with M=Ni and X=Y). The composition of the produced layer was:

| Element | Wt % | At % |
| --- | --- | --- |
| Al K | 4.92 | 9.85 |
| Y L | 0.58 | 0.36 |
| Cr K | 23.82 | 24.24 |
| Ni K | 71.18 | 65.55 |
| Total | 100.00 | 100.00 |

The oxygen flow was 0 sccm and the mechanical properties that were measured by using nanoindentation techniques were:

Mechanical properties: EIT=218 Gpa, HIT=9 GPa

A SEM-micrograph of a cross-section of this NiCrAlY ($Ni_{65.5}Cr_{24}Al_{10}Y_{0.5}$) layer deposited on a tungsten carbide substrate is shown in FIG. 3.

For another example, a target having chemical composition NiCrAlY1 67/22/10/1 (wt %) was also used for depositing by arc evaporation an NiCrAlYO layer (MCrAl—X-O with M=Ni and X=Y). The composition of the produced layer was:

| Element | Wt % | At % |
| --- | --- | --- |
| O K | 26.73 | 54.05 |
| Al K | 7.48 | 8.97 |
| Y L | 1.14 | 0.42 |
| Cr K | 13.42 | 8.35 |
| Ni K | 51.22 | 28.22 |
| Total | 100.00 | 100.00 |

The oxygen flow was 800 sccm and the mechanical properties that were measured by using nanoindentation:

Mechanical properties: EIT=280 Gpa, HIT=25 GPa

A SEM-micrograph of the cross-section of this deposited NiCrAlYO ($Ni_{28}Cr_{8.5}Al_9Y_{0.5}O_{54}$) layer on a tungsten carbide substrate is shown in FIG. 4. This example illustrates that the addition of oxygen to the layer results in a drastic increase of the indentation hardness HIT. The cross-section also shows the a much denser morphology of the synthesized coating if compared to the coating without the addition of oxygen.

For another example, a target having chemical composition NiCrAlY1 67/22/10/1 (wt %) was also used for depositing by arc evaporation an NiCrAlYO layer (MCrAl—X-O with M=Ni and X=Y). The composition of the produced layer was:

| Element | Wt % | At % |
|---|---|---|
| O K | 27.31 | 54.15 |
| AlK | 8.96 | 10.53 |
| Y L | 0.94 | 0.34 |
| CrK | 15.19 | 9.27 |
| NiK | 47.59 | 25.71 |
| Total | 100.00 | 100.00 |

The oxygen flow was 100 sccm and the mechanical properties that were measured by using nanoindentation techniques:

Mechanical properties: EIT=286 Gpa, HIT=29 GPa

A SEM-micrograph of the cross-section of this deposited NiCrAlYO ($Ni_{26}Cr_9Al_{10.5}Y_{0.5}O_{54}$) layer on a tungsten carbide substrate is shown in FIG. 5. This example illustrates again that the addition of oxygen to the layer results in a drastic increase of the indentation hardness HIT. The cross-section also shows a much denser morphology of the synthesized coating if compared to the coating without the addition of oxygen. It also shows that the layer morphology can be influenced by the amount of oxygen added to the synthesized coating (comparing FIGS. 4 and 5).

In another example, a target having chemical composition NiCrAlY1 67/22/10/1 (wt %) was also used for depositing by arc evaporation an NiCrAlY/NiCrAlYO layer (MCrAl—X+MCrAl—X-O with M=Ni and X=Y). The composition of the produced NiCrAlYO outermost layer was:

| Element | Wt % | At % |
|---|---|---|
| O K | 27.00 | 54.59 |
| AlK | 6.71 | 8.04 |
| Y L | 1.17 | 0.43 |
| CrK | 14.89 | 9.27 |
| NiK | 50.23 | 27.68 |
| Total | 100.00 | 100.00 |

The oxygen flow was set at 0 sccm for the deposition of the NiCrAlY layer and after that was set at 200 sccm for the deposition of the NiCrAlYO layer and the mechanical properties that were measured at the surface of the NiCrAlYO outermost layer by using nanoindentation techniques:

Mechanical properties: EIT=240 Gpa, HIT=27 GPa

A SEM-micrograph of the cross-section of this deposited NiCrAlY/NiCrAlYO ($Ni_{28}Cr_9Al_8Y_{0.5}O_{54.5}$) layer on a tungsten carbide substrate is shown in FIG. 6. This examples shows that a combination of a MCrAl—X coating and MCrAl—X-O coating can be realized in one deposition process and without interruption of the vacuum.

DESCRIPTION OF THE FIGURES

FIG. 11 shows Table 1 comprising examples of elemental compositions in wt. % of two superalloy substrates (Superalloy 1, Superalloy 2) and three MCrAl—X coating layers (NiCrAlY 1, NiCrAlY 2 and NiCrAlY 3).

Figure 1A:
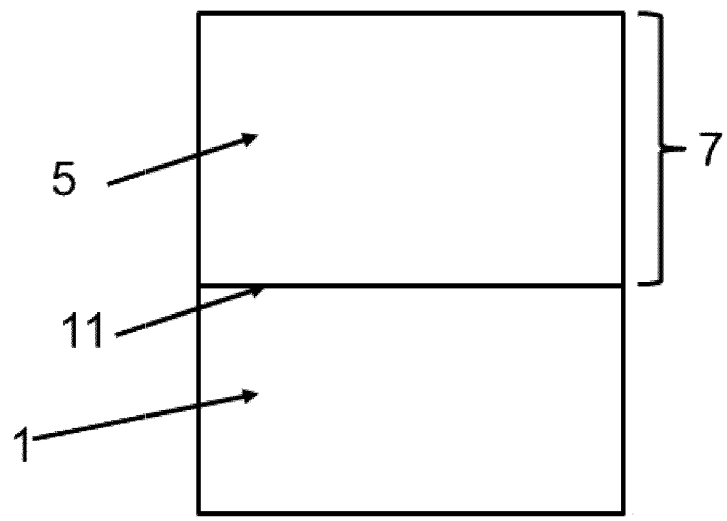
FIGS. 1a, 1b and 1c show schematically different architectures of a coating system deposited on a substrate according to the present invention.
Figure 1B:
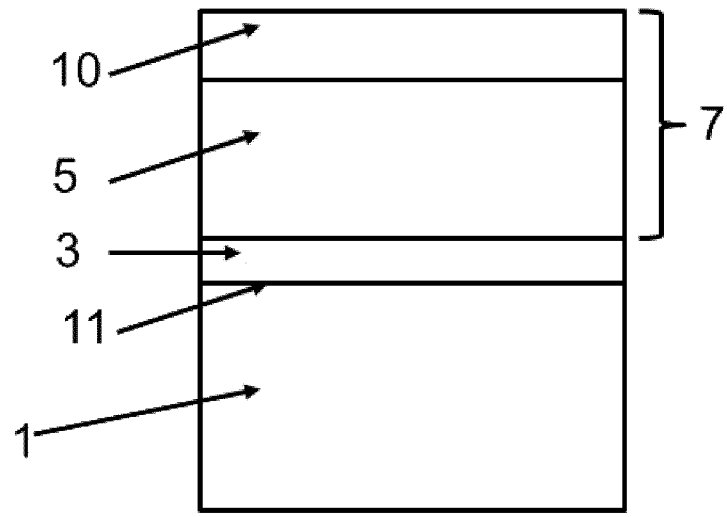
Figure 1C:
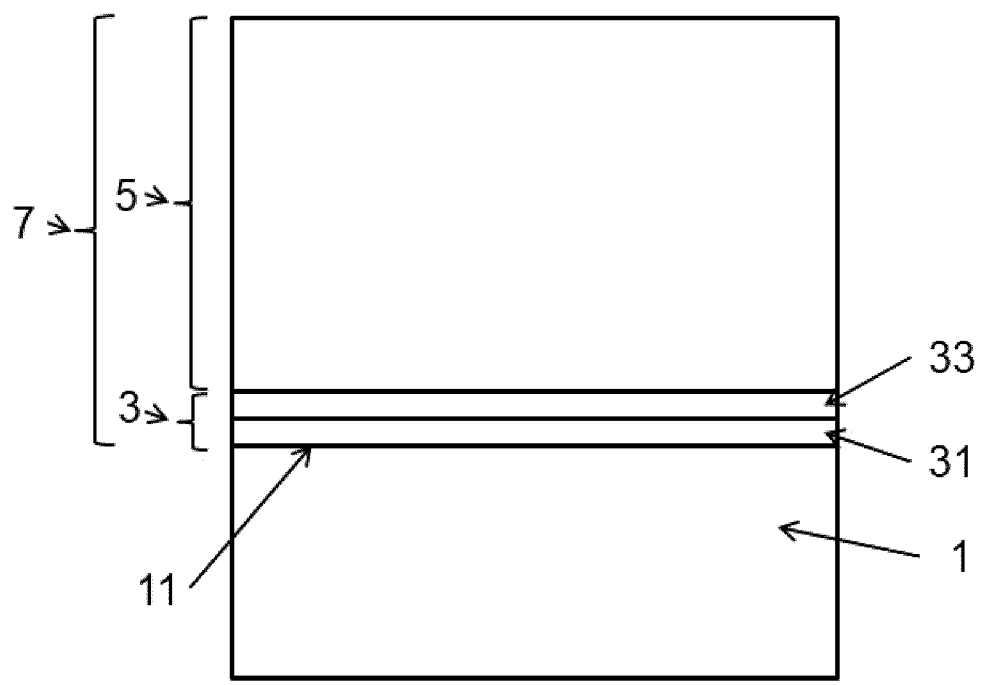
Figure 2:
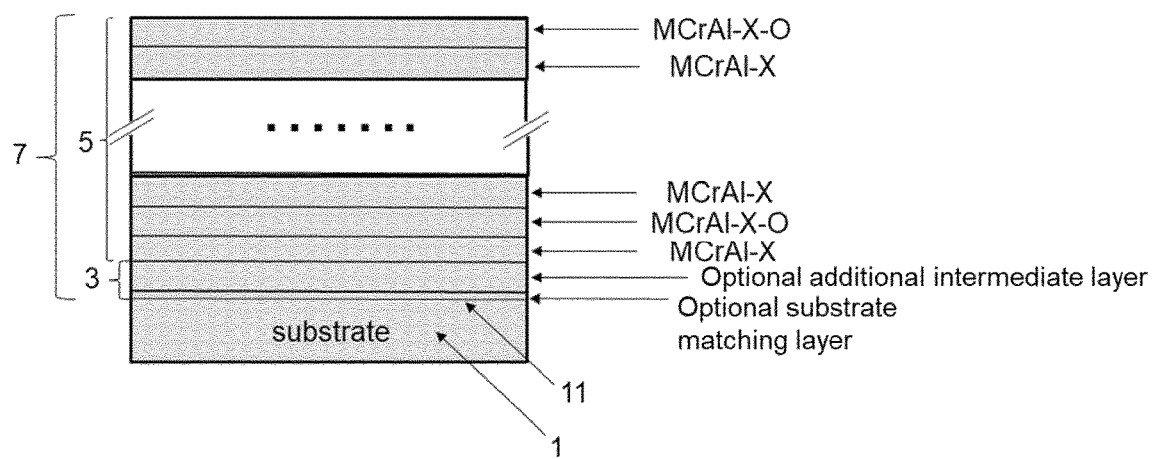
FIG. 2 shows an example of a coating architecture according to a further preferred embodiment of the present invention, in which the intermediate coating film 3 comprises a first layer of Cr deposited directly on the surface 11 of the substrate 1 and a second layer of Al—Cr deposited on the first layer. Furthermore, the functional coating film 5 is deposited on the intermediate coating film 3 and comprises a multilayered film comprising MCrAl—X layers and MCrAl—X-O layers deposited alternate one on each other.
Figure 3:
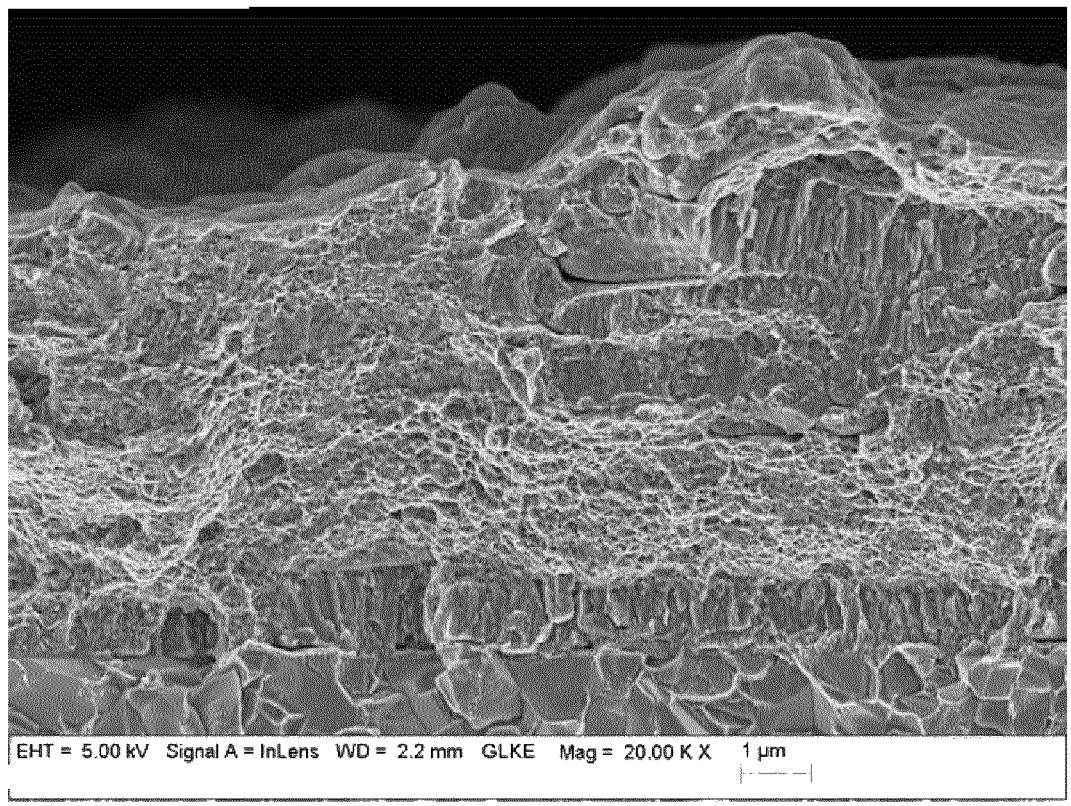
FIG. 3 shows a SEM-micrograph of a MCrAl—X layer deposited directly on the substrate—Oxygen flow: 0 sccm
Figure 4:
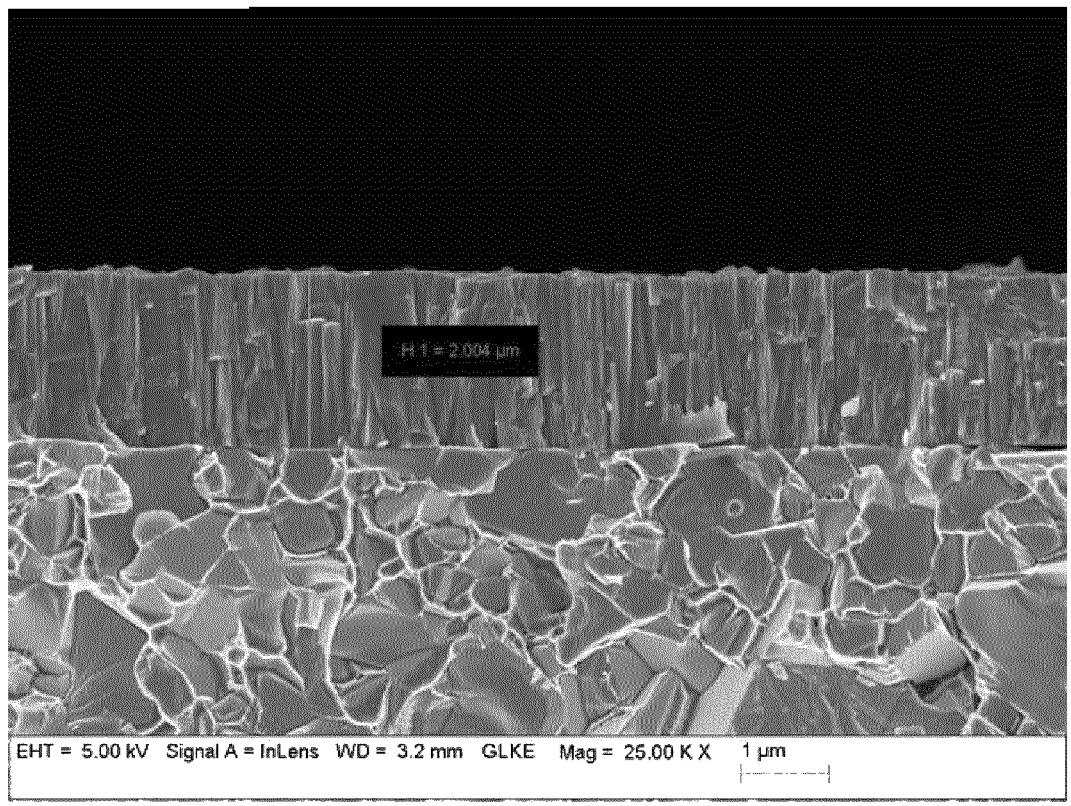
FIG. 4 shows a SEM-micrograph of a MCrAl—X-O layer deposited directly on the substrate—Oxygen flow: 800 sccm
Figure 5:
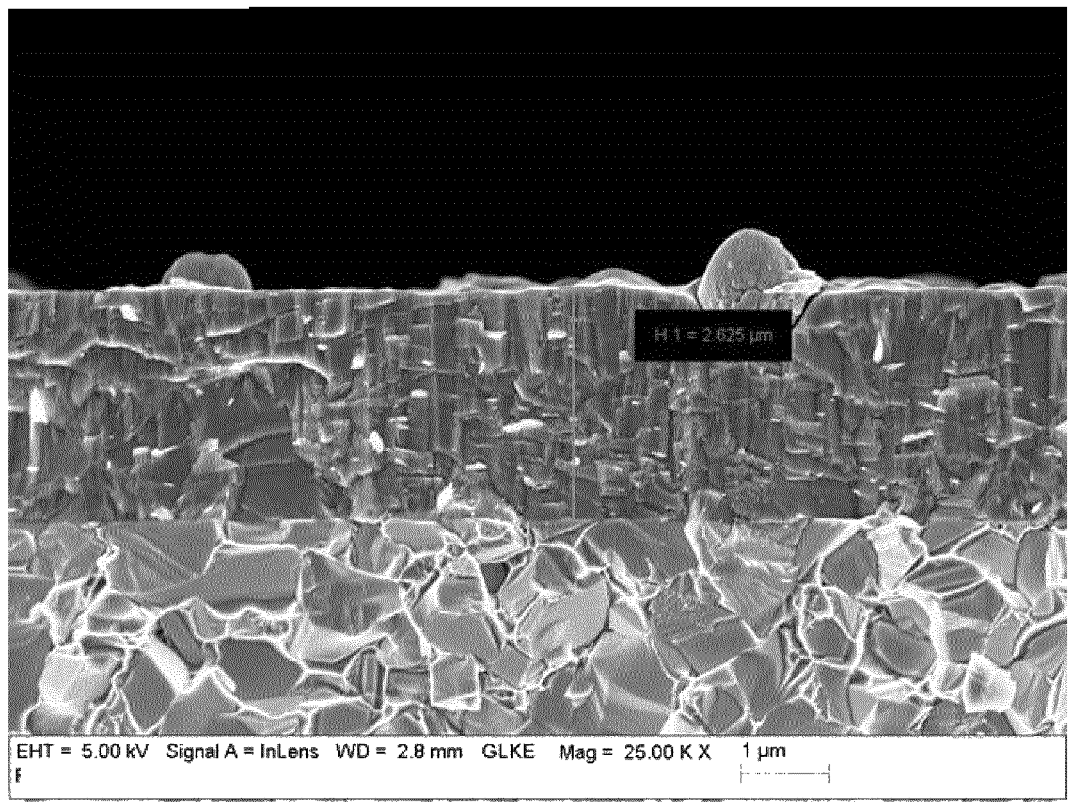
FIG. 5 shows a SEM-micrograph of a MCrAl—X-O layer deposited directly on the substrate—Oxygen flow: 100 sccm
Figure 6:
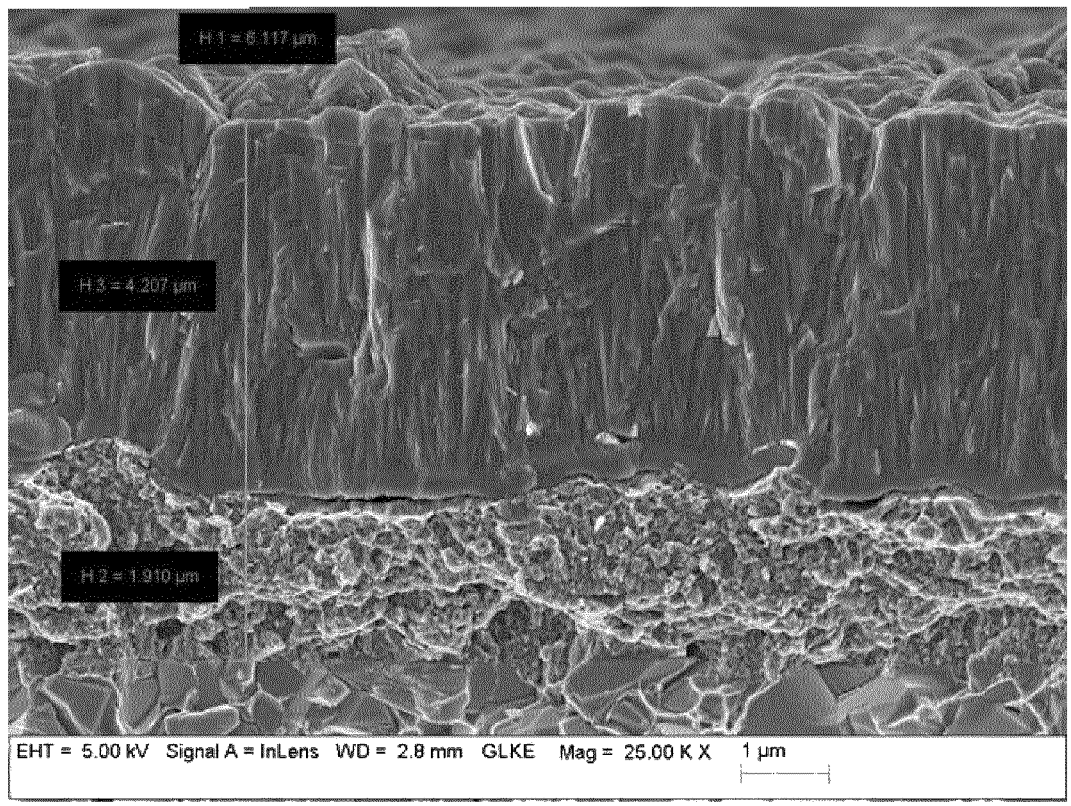
FIG. 6 shows a SEM-micrograph of a MCrAl—X/MCrAl—X-O layer deposited directly on the substrate—At the beginning the oxygen flow was set at 0 sccm for the deposition of the MCrAl—X layer, following the oxygen flow was set at 200 sccm for the deposition of the MCrAl—X-O layer
Figure 7:
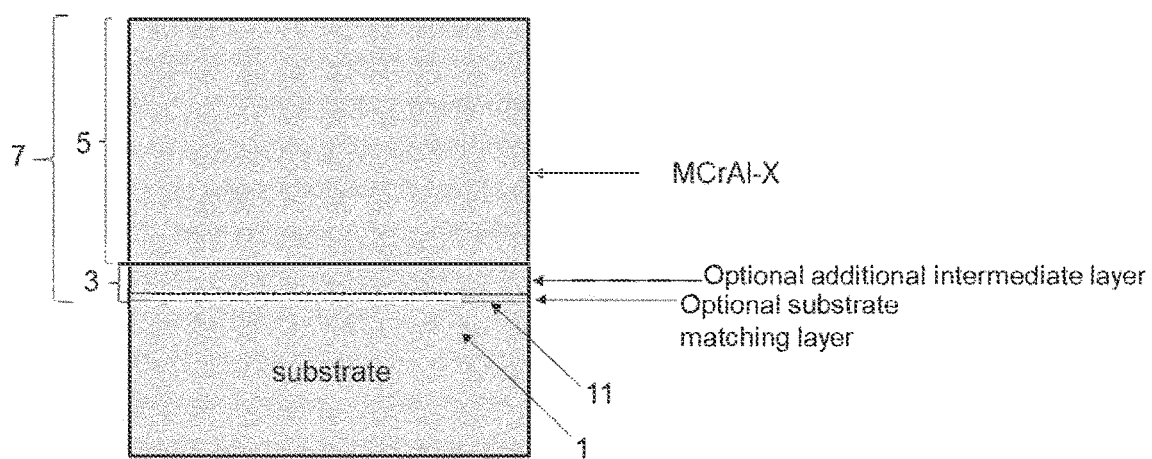
FIGS. 7-9 show advantageous coating system architectures for producing coated substrates according to the present invention.
Figure 8:
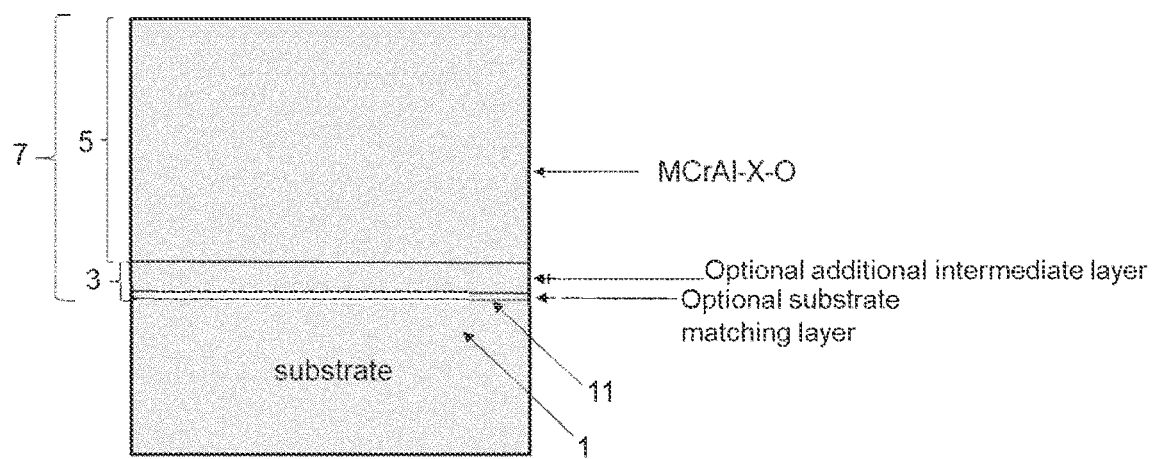
Figure 9:
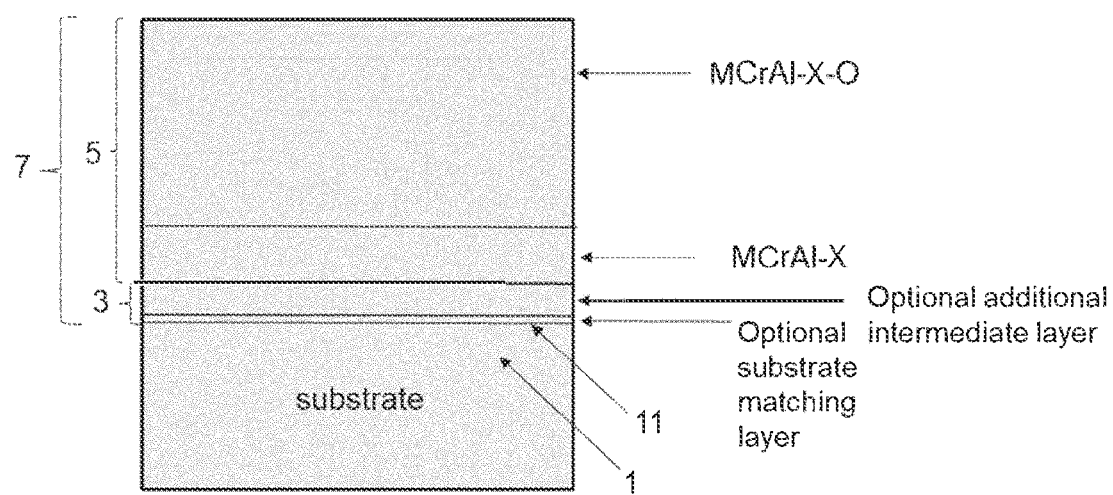
Figure 10:
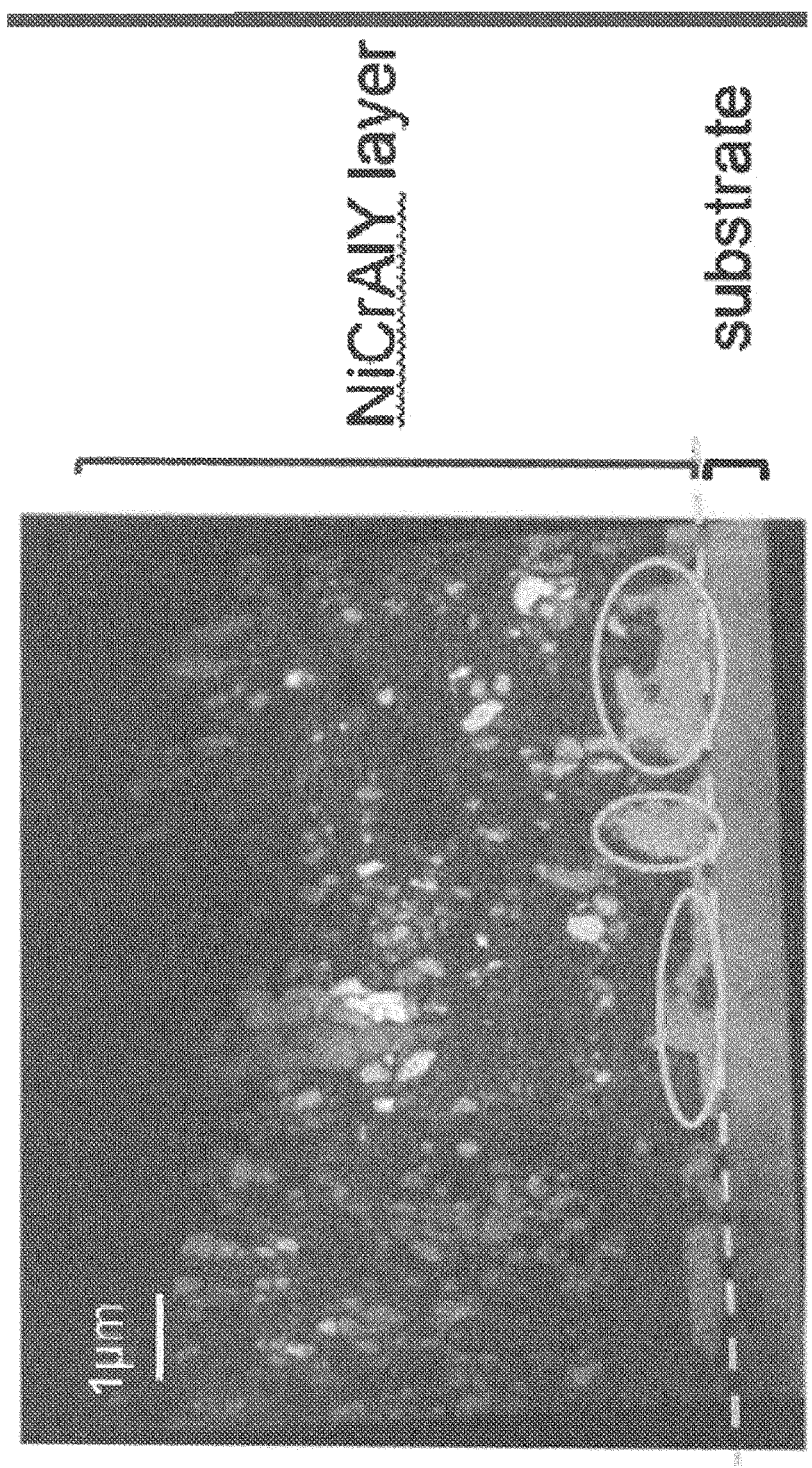
FIG. 10 shows the crystal orientation mapping based on EBSD of a cross-section of the interface of the NiCrAlY layer deposited on a single crystalline superalloy substrate 1 (PWA1483SX). The interface is marked by a dashed line. The regions of heteroepitaxial growth (coherency) of the layer with respect to the substrate are marked with circles. These regions confirm an in part heteroepitaxial growth (it means a local heteroepitaxial growth) of the MCrAl—X layer deposited directly on the metal substrate surface. A local epitaxial or heteroepitaxial growth should have preferably a thickness (in the coating thickness direction) of at least 100 nm, more preferably higher than 500 nm for attaining a more stable interface between substrate surface and MCrAl—X coating layer.

Concretely, the present invention relates to:

A coated substrate comprising a substrate (1) comprising a metal substrate surface (11) coated with a coating system (7) consisting of or comprising a functional coating film (5), said functional coating film (5) consisting of or comprising at least one MCrAl—X coating layer, wherein:
  the at least one MCrAl—X coating layer is deposited directly on the metal substrate (11), or
  the at least one MCrAl—X coating layer is deposited on an intermediate coating layer (3) that is formed of at least one substrate matching layer (31), wherein the at least one substrate matching layer (31) is deposited directly on the metal substrate surface (11),
and wherein the layer deposited directly on the metal substrate surface (11), it means respectively the MCrAl—X coating layer if it is deposited directly on the metal substrate surface (11) or the substrate matching layer (31) if it is deposited on the metal substrate surface (11) exhibits:
  epitaxial growth in part or totally, or
  heteroepitaxial growth in part or totally.

Preferably the material of the metal substrate surface (11) is a super alloy or a nickel aluminide.

Preferably the metal substrate surface (11) is a super alloy of the type nickel based super alloy or cobalt based super alloy or a nickel/cobalt based super alloy.

According to a preferred embodiment of the present invention the MCrAl—X coating layer comprises at least two sublayers, a first sublayer and a second sublayer, wherein the first sublayer is deposited nearest to the metal substrate surface (11) and the second sublayer is deposited onto the first sublayer, wherein the both the first sublayer and the second sublayer comprises the same elements but the second sublayer has a higher Al content than the first sublayer.

Preferably the MCrAl—X layer comprises at least two sublayers, a first sublayer and a second sublayer, wherein the second layer comprises oxygen and is therefore a MCrAl—X-O layer.

Preferably the concentration of Al in the second sublayer in relation to the first sublayer taking into account only the concentration of the metallic components M, Cr and Al in atomic percentage is twice as much.

The oxygen in the second sublayer can increase gradually.

The aluminum in the second sublayer can also increase gradually.

Preferably in the MCrAl—X layer, and if present then also in the MCrAl—X-O material:

M is Ni or Co or Ni—Co, and

X is Y or Er or Zr.

According to a preferred embodiment of the present invention at least one layer of MCrAl—X-O material present in the functional coating film (5) has indentation hardness (HIT)—measured by using nanoindentation techniques—in the range between 18 GPa and 35 GPa+/−2 GPa, the range including the border values 18 GPa and 35 GPa.

Preferably at least one layer of MCrAl—X material present in the functional coating film (5) has indentation hardness (HIT)—measured by using nanoindentation techniques—of 9 GPa+/−2 GPa.

Preferably at least one layer of MCrAl—X-O material present in the functional coating film (5) has elastic modulus (EIT)—measured by using nanoindentation techniques—in the range between 270 GPa and 320 GPa+/−5 GPa, the range including the border values 270 GPa and 320 GPa.

Preferably at least one layer of MCrAl—X material present in the functional coating film (5) has elastic modulus (EIT)—measured by using nanoindentation techniques—of 220 GPa+/−5 GPa.

According to a preferred embodiment of the present invention, in which at least one layer of MCrAl—X-O material is present in the functional coating film (5), this layer comprises an oxygen content corresponding to a value between 50 at. % and 60 at. %+/−3 at. %—the range including the border values 50 at. % and 60 at. %—considering all elements present in this layer for the determination of the element composition in atomic percentage.

Preferably the oxygen content corresponds to a value higher than 50 at. %.

Preferably the oxygen content corresponds to a value lower than 60 at. %.

According to a preferred embodiment of the present invention at least one layer of MCrAl—X material is present in the functional coating film (5), wherein this layer exhibits fcc crystalline structure.

A preferred method for producing a coated substrate according to any of the embodiments mentioned above, comprises a step in which the at least one layer of the type MCrAl—X is deposited by using a physical vapor deposition (PVD) technique, wherein the used PVD technique is arc evaporation or magnetron sputtering, and wherein a target composed of M, Cr, Al and X is used as coating source material and in case of deposition of at least one layer of the type MCrAl—X-O, oxygen flow gas is used as reactive gas.

The deposition method for depositing the at least one layer of the type MCrAl—X coating layer can be a magnetron sputtering technique of the type high power impulse magnetron sputtering (HiPIMS).

According to a preferred embodiment of the present invention, the layer that is deposited directly on the metal substrate surface (11) has a similar crystalline structure compared to the crystalline structure of the material of the metal substrate (1), respectively of the metal substrate surface (11), wherein the maximal mismatch in the lattice parameter is of 5%, preferably maximal 1%.

The present invention relates also to coated substrates comprising at least one metal substrate surface (11) coated with a coating system (7) comprising a functional coating film (5) and an intermediate coating film (3) deposited between the at least one metal surface (11) and the functional coating film (5), wherein the functional coating film (5) comprises at least one layer of the type MCrAl—X and/or at least one layer of the type MCrAl—X-O and the intermediate coating film (3), wherein the at least one layer of the type MCrAl—X and/or the at least one layer of the type MCrAl—X-O is deposited by means of arc evaporation or magnetron sputtering, if sputtering preferably HiPIMS, directly on the at least one metal surface (11).

A preferred method for producing a coated substrate according the directly above described embodiment, comprises a step in which the at least one layer of the type MCrAl—X is deposited by the at least one layer of the type MCrAl—X and/or the at least one layer of the type MCrAl—X-O is deposited by using a physical vapor deposition (PVD) technique, wherein the used PVD technique is arc evaporation or magnetron sputtering, if sputtering preferably HiPIMS, wherein a target composed of M, Cr, Al and X is used as coating source material and in case of deposition of at least one layer of the type MCrAl—X-O, oxygen flow gas is used as reactive gas.

For the PVD deposition of the MCrAl—X and MCrAl—X-O layers as described in the present invention usual coating parameters can be used.

For example, for the deposition of a MCrAl—X coating layer by using arc evaporation PVD techniques and a target composed of M. Cr, Al and X as described above, the arc current can be adjusted to be in a typical range or arc current for such kind of PVD processes, for example a value between 100 A and 200 A. The substrate temperature during deposition can be also adjusted to be in known substrate temperature ranges, for example between 200° C. and 800° C. or between 400° C. and 600° C.

Before coating deposition, the substrate surfaces to be coated should be/can be cleaned and pre-treated in known manner (e.g. by using known cleaning processes and plasma pretreatment processes).

The invention claimed is:

1. A coated substrate comprising a substrate having a metal substrate surface coated with a coating system consisting of or comprising a functional coating film, said functional coating film consisting of or comprising at least one MCrAl-X coating layer, wherein the MCrAl-X coating layer comprises at least two sublayers, a first sublayer and a second sublayer, wherein the first sublayer is deposited nearest to the metal substrate surface and the second sublayer is deposited onto the first sublayer, wherein both the first sublayer and the second sublayer comprise the same elements but the second sublayer has a higher Al content than the first sublayer, and the second sublayer comprises oxygen and is therefore a MCrAI-X-0 layer, wherein
- the at least one MCrAI-X coating layer is deposited directly on the metal substrate surface, or
- the at least one MCrAI-X coating layer is deposited on an intermediate coating layer that is formed of at least one substrate matching layer, wherein the at least one substrate matching layer is deposited directly on the metal substrate surface,
- wherein the layer deposited directly on the metal substrate surface means respectively the MCrAI-X coating layer if it is deposited directly on the metal substrate surface or the substrate matching layer if it is deposited directly on the metal substrate surface exhibits:
- epitaxial growth in part or totally, or
- heteroepitaxial growth in part or totally.

2. The coated substrate according to claim 1, wherein the metal substrate surface is a super alloy or a nickel aluminide.

3. The coated substrate according to claim 2, wherein the metal substrate surface is a super alloy of the type nickel-based super alloy or cobalt-based super alloy or a nickel/cobalt-based super alloy.

4. The coated substrate according to claim 1, wherein a concentration of Al in the second sublayer in relation to the first sublayer taking into account only a concentration of metallic components M, Cr and Al in atomic percentage is twice as much.

5. The coated substrate according to claim 1, wherein the oxygen in the second sublayer increases gradually.

6. The coated substrate according to claim 1, wherein aluminum in the second sublayer increases gradually.

7. The coated substrate according to claim 1, wherein at least one layer of MCrAI-X material is present in the functional coating film, and the at least one layer of MCrAI-X material exhibits fcc crystalline structure.

8. The coated substrate according to claim 1, wherein the layer that is deposited directly on the metal substrate surface has a similar crystalline structure compared to a crystalline structure of the material of the metal substrate, respectively of the metal substrate surface, wherein a maximal mismatch in a lattice parameter is of 5%.

9. A method for producing the coated substrate according to claim 1, comprising depositing the at least one layer of the type MCrAI-X by using a physical vapor deposition (PVD) technique, wherein the PVD technique is arc evaporation or magnetron sputtering, and wherein a target composed of M, Cr, Al and X is used as coating source material.

10. The method according to claim 9, wherein the magnetron sputtering technique is a high power impulse magnetron sputtering (HiPIMS) technique.

11. A coated substrate comprising a substrate having a metal substrate surface coated with a coating system consisting of or comprising a functional coating film, said functional coating film consisting of or comprising at least one MCrAI-X coating layer, wherein
- the at least one MCrAI-X coating layer is deposited directly on the metal substrate surface, or
- the at least one MCrAI-X coating layer is deposited on an intermediate coating layer that is formed of at least one substrate matching layer,
- wherein the at least one substrate matching layer is deposited directly on the metal substrate surface,
- wherein the layer deposited directly on the metal substrate surface means respectively the MCrAI-X coating layer if it is deposited directly on the metal substrate surface or the substrate matching layer if it is deposited directly on the metal substrate surface exhibits:
- epitaxial growth in part or totally, or
- heteroepitaxial growth in part or totally; and
- wherein the functional coating film further comprises at least one layer of MCrAI-X-O material, and in the MCrAI—X layer and also in the MCrAI-X-O material:
- M is Ni or Co or Ni-Co, and
- X is Y or Er or Zr.

12. The coated substrate according to claim 11, wherein at least one layer of MCrAI-X-O material present in the functional coating film has an indentation hardness (HIT)—measured by using nanoindentation techniques—in a range between 18 GPa and 35 GPa+/−2 GPa, the range including the border values 18 GPa and 35 GPa.

13. The coated substrate according to claim 11, wherein at least one layer of MCrAI-X material present in the functional coating film has an indentation hardness (HIT)—measured by using nanoindentation techniques—of 9 GPa+/−2 GPa.

14. The coated substrate according to claim 11, wherein at least one layer of MCrAI-X-O material present in the functional coating film has an elastic modulus (EIT)—measured by using nanoindentation techniques—in a range between 270 GPa and 320 GPa+/−5 GPa, the range including border values 270 GPa and 320 GPa.

15. The coated substrate according to claim 11, wherein at least one layer of MCrAI-X material present in the functional coating film has an elastic modulus (EIT)— measured by using nanoindentation techniques—of 220 GPa+/−5 GPa.

16. The coated substrate according to claim 11, wherein at least one layer of MCrAI-X-O material is present in the functional coating film, wherein the at least one layer of MCrAI-X-O material comprises an oxygen content corresponding to a value in a range between 50 at. % and 60 at. %+/−3at. %— the range including border values 50 at. % and 60 at. %— considering all elements present in the at least one layer of MCrAI-X-O material for determining element composition in atomic percentage.

17. The coated substrate according to claim 16, wherein the oxygen content corresponds to a value higher than 50 at. % and up to and including 60 at. %.

18. The coated substrate according to claim 16, wherein the oxygen content corresponds to a value in a range from 50 at. % up to lower than 60 at. %.

19. A coated substrate comprising at least one metal substrate surface coated with a coating system comprising a functional coating film and an intermediate coating film deposited between the at least one metal substrate surface and the functional coating film, wherein the functional coating film comprises at least one layer of the type MCrAl X and at least one layer of the type MCrAI-X-O and the intermediate coating film, wherein the at least one layer of the type MCrAI-X and/or the at least one layer of the type MCrAI-X-O is deposited directly on the at least one metal substrate surface using arc evaporation or magnetron sputtering.

20. A method for producing the coated substrate according to claim 19, comprising depositing the at least one layer of the type MCrAI-X and/or the at least one layer of the type MCrAI-X-O using a physical vapor deposition (PVD) technique, wherein the PVD technique is arc evaporation or magnetron sputtering, and wherein a target composed of M, Cr, Al and X is used as a coating source material and in case of deposition of at least one layer of the type MCrAl-X-O, oxygen flow gas is used as reactive gas.

\* \* \* \* \*